United States Patent
Williams

(10) Patent No.: US 7,114,961 B2
(45) Date of Patent: Oct. 3, 2006

(54) ELECTRICAL CONNECTOR ON A FLEXIBLE CARRIER

(75) Inventor: John D. Williams, Sunnyvale, CA (US)

(73) Assignee: Neoconix, Inc., Sunnyvale, CA (US)

( * ) Notice: Subject to any disclaimer, the term of this patent is extended or adjusted under 35 U.S.C. 154(b) by 0 days.

(21) Appl. No.: 11/265,205

(22) Filed: Nov. 3, 2005

(65) Prior Publication Data

US 2006/0113107 A1   Jun. 1, 2006

Related U.S. Application Data

(63) Continuation-in-part of application No. 10/412,729, filed on Apr. 11, 2003.

(51) Int. Cl.
  *H01R 12/00* (2006.01)
(52) U.S. Cl. ........................................... 439/66
(58) Field of Classification Search .................. 439/66, 439/71, 74
  See application file for complete search history.

(56) References Cited

U.S. PATENT DOCUMENTS

| | | | | |
|---|---|---|---|---|
| 3,670,409 A * | 6/1972 | Reimer | ......................... | 29/853 |
| 5,152,695 A * | 10/1992 | Grabbe et al. | ................. | 439/71 |
| 5,173,055 A * | 12/1992 | Grabbe | ......................... | 439/66 |
| 5,802,699 A * | 9/1998 | Fjelstad et al. | ................. | 29/593 |
| 5,812,378 A * | 9/1998 | Fjelstad et al. | ............. | 361/769 |
| 5,984,691 A * | 11/1999 | Brodsky et al. | ............... | 439/66 |
| 6,042,387 A * | 3/2000 | Jonaidi | ......................... | 439/66 |
| 6,196,852 B1 * | 3/2001 | Neumann et al. | .............. | 439/66 |
| 6,200,143 B1 * | 3/2001 | Haba et al. | ..................... | 439/70 |
| 6,205,660 B1 * | 3/2001 | Fjelstad et al. | ................ | 29/885 |
| 6,374,487 B1 * | 4/2002 | Haba et al. | ..................... | 29/840 |
| 6,428,328 B1 * | 8/2002 | Haba et al. | ..................... | 439/70 |
| 6,517,362 B1 * | 2/2003 | Hirai et al. | ..................... | 439/82 |
| 6,558,560 B1 * | 5/2003 | Clements et al. | ............. | 216/18 |
| 6,627,092 B1 * | 9/2003 | Clements et al. | ............. | 216/13 |
| 6,661,247 B1 * | 12/2003 | Maruyama et al. | ......... | 324/765 |
| 6,664,131 B1 * | 12/2003 | Jackson | ....................... | 438/108 |
| 6,763,581 B1 * | 7/2004 | Hirai et al. | ..................... | 29/852 |
| 6,821,129 B1 * | 11/2004 | Tsuchiya | ...................... | 439/66 |
| 6,869,290 B1 * | 3/2005 | Brown et al. | .................. | 439/66 |
| 6,916,181 B1 * | 7/2005 | Brown et al. | .................. | 439/66 |
| 2003/0019836 A1 * | 1/2003 | Clements et al. | ............. | 216/13 |
| 2003/0022503 A1 * | 1/2003 | Clements et al. | ............ | 438/694 |
| 2003/0022532 A1 * | 1/2003 | Clements et al. | ............. | 439/66 |
| 2004/0253845 A1 * | 12/2004 | Brown et al. | .................. | 439/66 |
| 2004/0253846 A1 * | 12/2004 | Brown et al. | .................. | 439/66 |
| 2006/0024989 A1 * | 2/2006 | Lindsey et al. | ............... | 439/66 |
| 2006/0046533 A1 * | 3/2006 | Okamoto et al. | ............. | 439/74 |

* cited by examiner

*Primary Examiner*—Ross Gushi
(74) *Attorney, Agent, or Firm*—Pillsbury Winthrop Shaw Pittman LLP

(57) ABSTRACT

A compliant, scalable, thermal-electrical-mechanical, flexible electrical connector. In one configuration, the flexible electrical connector comprises a flexible substrate, a first and second conductive layer, and a plating contiguously applied over the conductive layers and holes through the substrate. The first and second conductive layers are adhered to opposite sides of the flexible substrate and have a plurality of raised contact elements in registration with at least a subset of the holes. At least some contact elements on the first and second conductive layers that oppose each other are in electrical communication with one another by way of the plating.

25 Claims, 7 Drawing Sheets

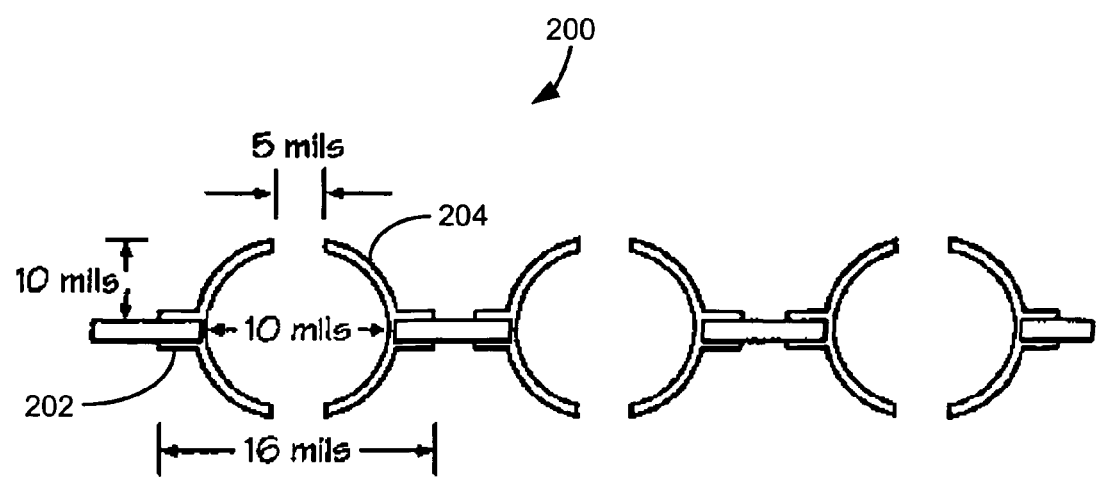
FIG. 2
   
FIG. 3A       FIG. 3B       FIG. 3C       FIG. 3D

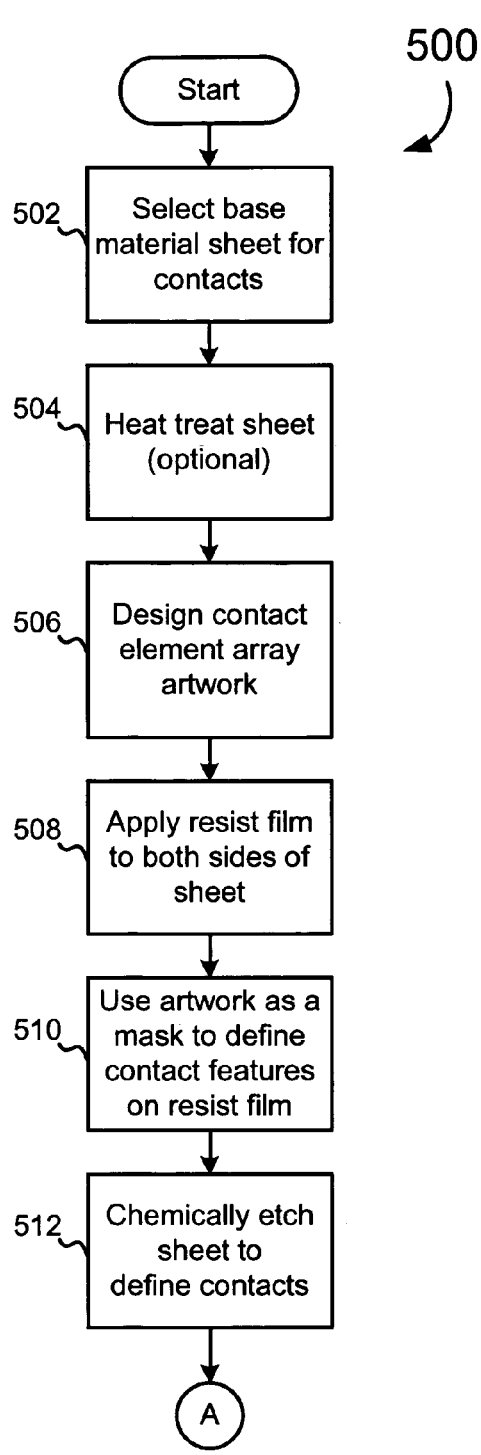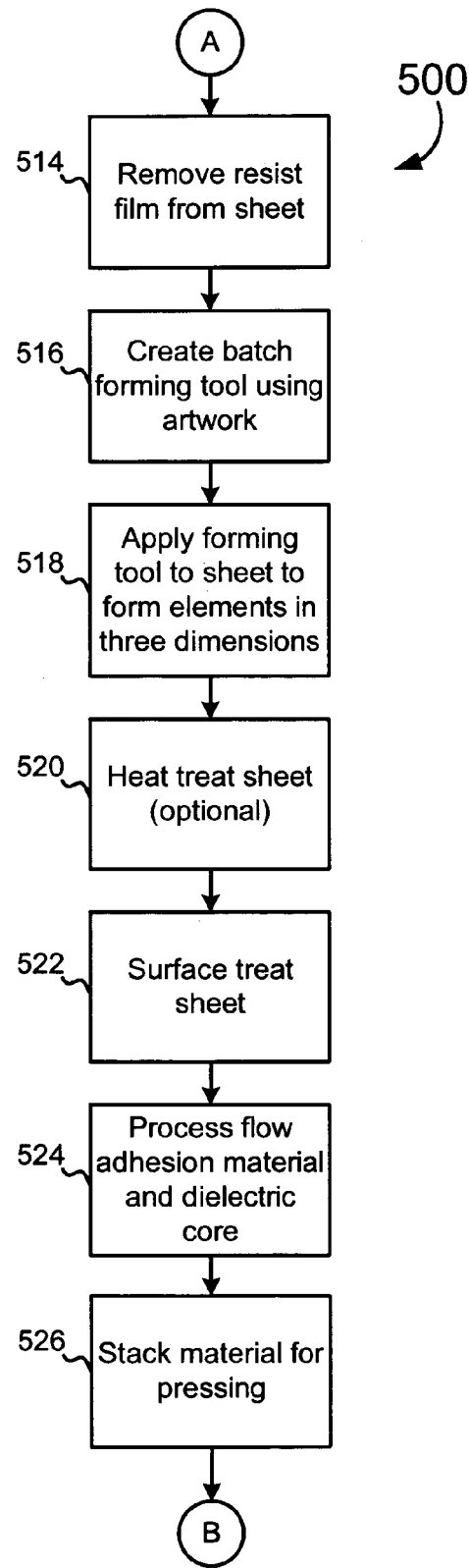
FIG. 5A
FIG. 5B

ELECTRICAL CONNECTOR ON A FLEXIBLE CARRIER

This application is a continuation-in-part application of U.S. patent application Ser. No. 10/412,729 filed on Apr. 11, 2003.

BACKGROUND

1. Field of Invention

This invention relates to electrical connectors, and in particular, to a compliant, scalable, thermal-electrical-mechanical reconnectable and remountable electrical connector constructed on a flexible carrier.

2. Background of the Invention

Conventional electrical connectors used to connect components such as printed circuit boards are fabricated using a wide variety of techniques. A common approach is to use stamped metal springs, which are formed and then individually inserted into an insulating carrier to form an array of electrical connection elements. The insulating carrier is typically made of a rigid electrically non-conductive material. Other approaches to making electrical connectors include using anisotropically conductive adhesives, injection molded conductive adhesives, bundled wire conductive elements, and small solid pieces of metal typically in a rigid carrier.

Two dimension flex circuits are readily available and well known in the electronics industry. For example, common applications in which flex circuits can be utilized are cell phones, board to board, and flat panel displays.

Flex circuitry is typically used to transport low and high-speed signals within the flexible carrier material. To access internal signals one must connect to them through a series of vias or by surface mount pads and/or connectors.

As system density and performance have increased, so have the stringent specifications for interconnections. One way high electrical performance is manifested is in improved thermal characteristics and signal integrity. This can be accomplished by designing the interconnections such that they allow thermal planes or materials to be designed directly into the interposer or carrier. These features can then be directly connected to the contact elements. A similar argument can be given for the addition of other circuitry and or discretes placed directly on or embedded internally to the interposer.

DESCRIPTION OF THE DRAWINGS

FIG. 2 is a schematic diagram illustrating an enlarged sectional view of the contact arms for an exemplary Land Grid Array contact array.

FIGS. 3A–3D are schematic diagrams of enlarged perspective views of different exemplary contact arm designs.

FIGS. 5A–5D are flowcharts showing exemplary steps for making a connector according to an aspect of the present invention.

DETAILED DESCRIPTION

Figure 1:
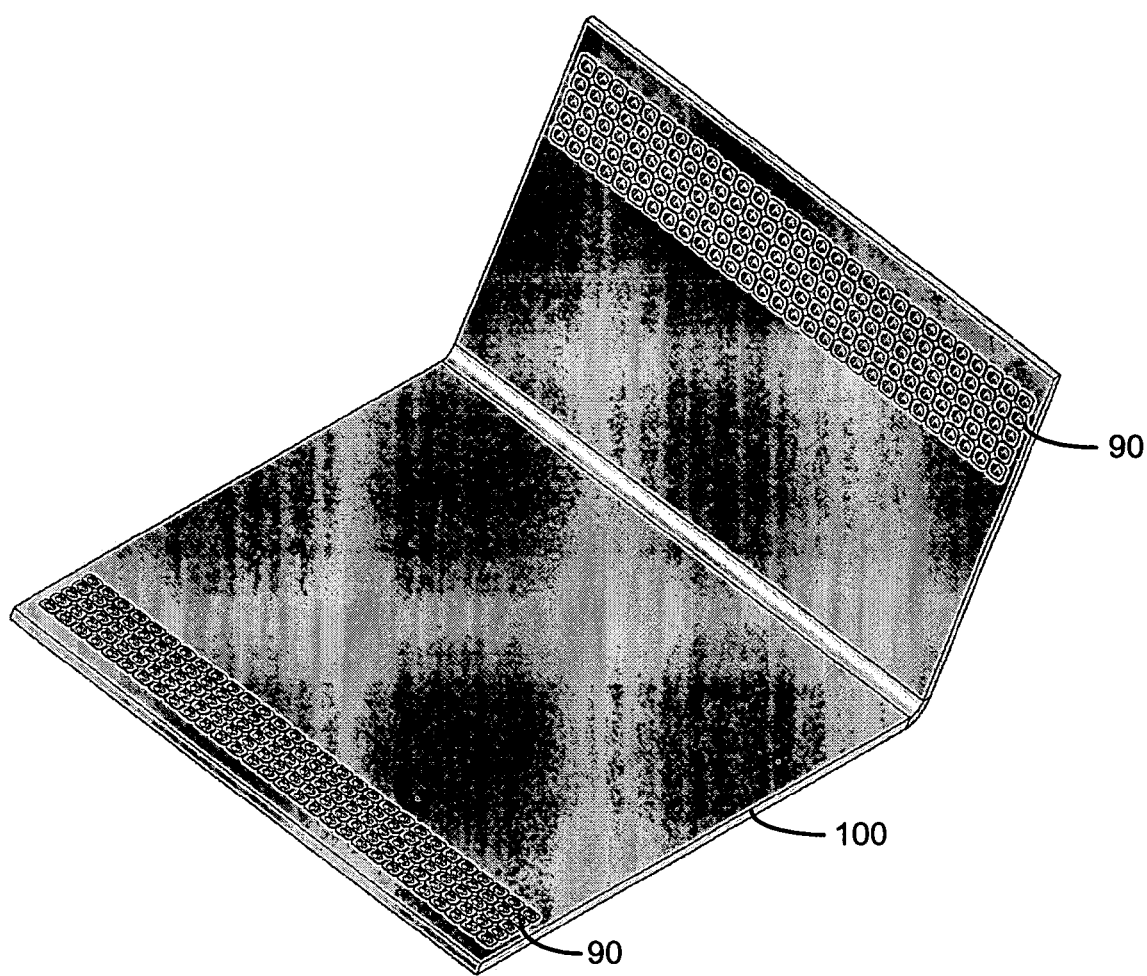
FIG. 1 is a schematic diagram that shows a number of land grid array structures on flex material.

The present invention provides a compliant, scalable, thermal-electrical-mechanical electrical connector constructed on a flexible substrate, and in another aspect, discloses methods for making same. In employing a thin flexible substrate, the invention provides a connector with compliance from not only the elastic contacts themselves, but also from the flexible substrate on which the contacts are mounted. The overall compliance of the connector is equal to the sum of the compliance of the contacts and the compliance of the substrate. With this increased compliance, the connector can better accommodate uneven contact arrays to which it is matched. In this manner, desirable connector properties can be achieved in a flexible carrier or circuit implementation.

The connector takes advantage of a compound system of compliance (C1+C2) where C1 is the compliance of the thin flexible insulating substrate and C2 is the compliance of the array of compliant contacts formed on the substrate. This added aspect of compliance provided by the flexible substrate allows the array of mating surfaces to behave much like a floating array of contacts. This approach allows the overall system flexibility or compliance to be greatly increased over that of contacts being constructed on a rigid substrate.

The invention's use of a thin flexible substrate also eliminates the need to pre-plate through holes in the substrate. Indeed, the reduction in thickness of the substrate minimizes the amount of electrical interface between two electrical circuits. Since the contact arrays on either side of the substrate are in close proximity to each other, separated by the thin substrate, the entire assembly can be plated after the contact arrays are adhered to the substrate creating a monolithic structure. This approach minimizes material build-up in the contact, in comparison to pre-plated through holes. Such material build-up can result in the contact being stiffer than desired, resulting in less compliance.

According to one aspect of the present invention, an exemplary connector comprises a thin flexible Kapton™ substrate bonded to contact sheets with a low flow adhesion material, such as acrylic. The corresponding holes in the contact sheets and the substrate can be sized relative to each other to provide an area in which excess adhesive can collect.

Another aspect of the present invention provides a method of increasing overall contact density or of decreasing pitch by using top and bottom surfaces to help maximize the surface area on which the contact elements can be disposed. The present invention provides a connector having a high-density array (also referred to herein as "fine pitch", referring to the distance separating the centers of nearest neighbor connectors) of deformable contacts that operate over a working distance of more than 0.2 mm with an approximate low resistance and inductance of less than fifteen mΩ and less than 0.5 nH, respectively.

The typical mechanical and electrical characteristics of the contacts of the invention described in application Ser. No. 10/412,729 include a working range greater than 5 mils, a contact force of less than 30 g, wiping action having both horizontal and vertical components for reliability, a durability of greater than one hundred thousand cycles, temperature operability greater than 125° C., inductance less that 0.3 nH, current capacity greater than 1.5 A, a scalable pitch less that 20 mils, and a functional elasticity across a working range to pitch ratio between a range of about 0.4 to 0.8. application Ser. No. 10/412,729 also describes multiple methods for fabricating the contacts and connectors.

The displacement range (elasticity) for the contacts described in application Ser. No. 10/412,729 is approximately between 0.12 mm and 0.4 mm. The size range for the described flange springs is between approximately 0.12 mm and 0.8 mm. Consequently, the elasticity-to-size ratio is in the approximate range of between 0.5 and 1.0.

In accordance with the present invention, a flexible carrier provides additional working range compliance. As described above, the combination of the substrate flexure and the elasticity of the contacts enables a connector to be even more accommodating to non-coplanarity. In this manner, for example, a first array of contact elements and a second array of contact elements can share the same flexible substrate but be oriented in different planes with respect to each other.

Suitable substrates for the flexible carrier include, but are not limited to, Kapton™ polyimide ½–5 mils in thickness, Mylar™ polyester 2–5 mils thick, epoxy, and Teflon™.

FIG. 1 shows an exemplary configuration according to an aspect of the present invention, with a Land Grid Array (LGA) structure 90 attached to desired points of use. In this example, LGA structure 90 is integrated into flex circuitry 100. In this manner, any internal circuitry can be directly connected to internal signal layers. This configuration therefore offers electrical benefits over other conventional approaches, in the form of: i) shielded contacts ii) matched impedances; and iii) matched electrical trace lengths through the connector.

FIG. 2 shows a cross-sectional view of an exemplary connector 200 in accordance with an aspect of the present invention, including showing some exemplary dimensions of portions of the contact element 202. The spacing between the distal ends of the facing spring portions 204 is 5 mils, for example. The height of the contact element 202 from the surface of the flexible substrate 100 to the top of the spring portion is 10 mils, for example. The width of a via through flexible substrate 100 can be on the order of 10 mils, for example. The width of the contact element 202 from the outer edge of one base portion to the outer edge of the other base portion can be 16 mils, for example. Contacts of this size can be formed in accordance with the method of the invention as described below, allowing connectors with a pitch well below 50 mils and on the order of 20 mils or less.

According to one aspect of the present invention, mechanical properties of a contact element or a set of contact elements can be specifically engineered to achieve certain desired operational characteristics. For example, the contact force for each contact element can be selected to ensure either a low resistance connection for some contact elements or a low overall contact force for the connector. As another example, the elastic working range of each contact element can be varied. As another example, the vertical height of each contact element can be varied. As another example, the pitch or horizontal dimensions of the contact element can be varied.

FIGS. 3A–3D illustrate exemplary contact arm designs for either a Ball Grid Array (BGA) or a LGA system. As mentioned above, these contacts can be formed using a process similar to that used in PCB manufacturing to make a spring-like structure, and can be heat treated before or after forming.

Figure 4:
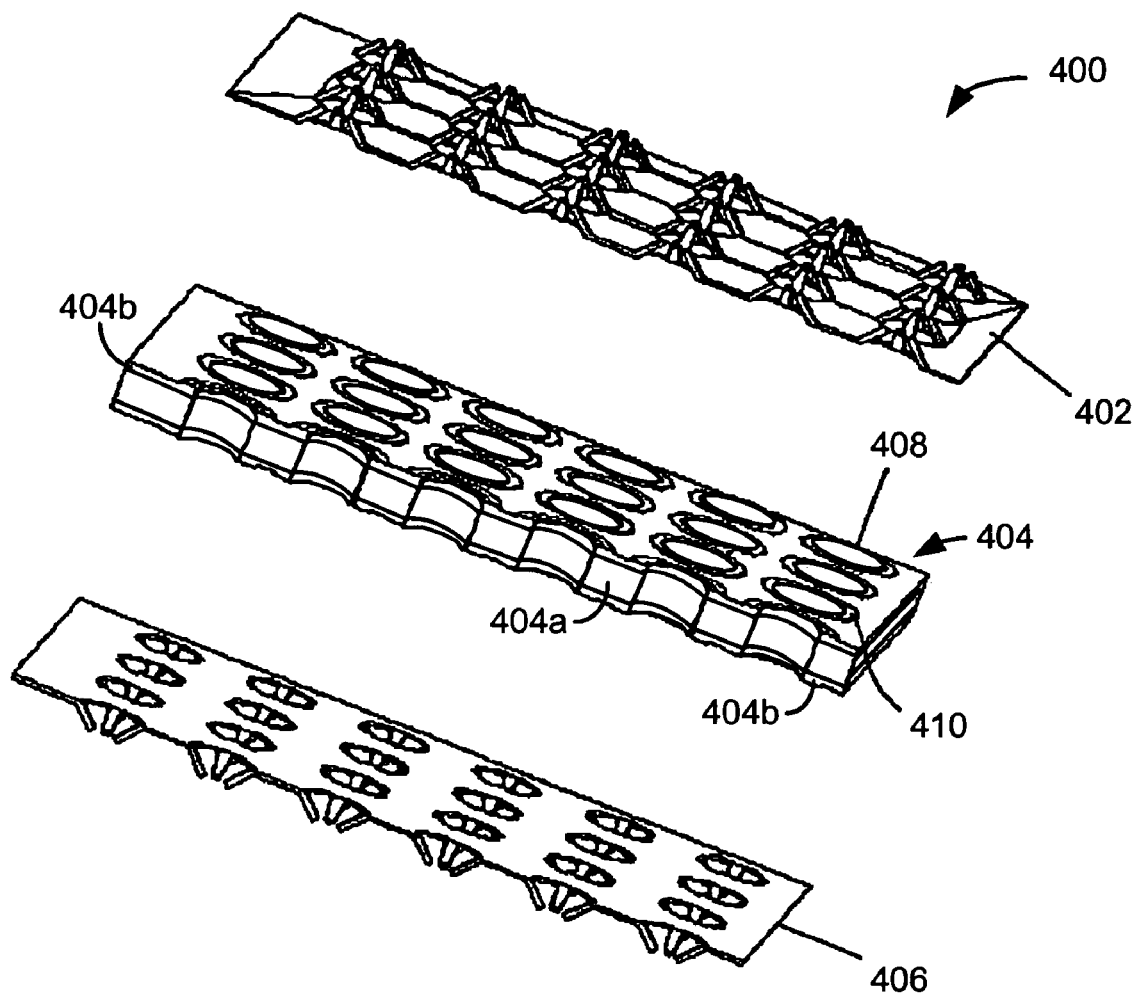
FIG. 4 is schematic diagram of an exploded perspective view of a connector according to one configuration of the invention.
Figure 5C:
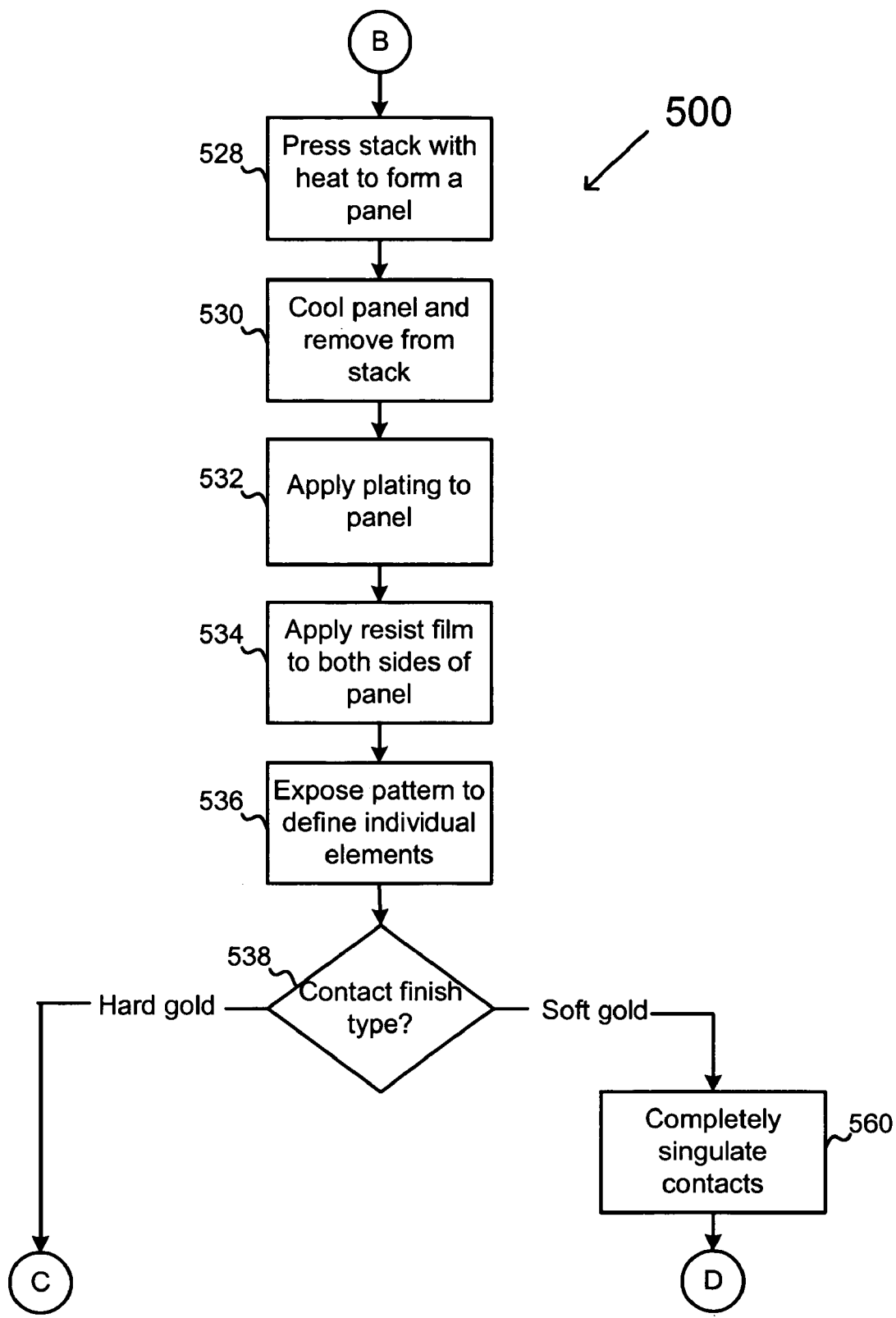
Figure 5D:
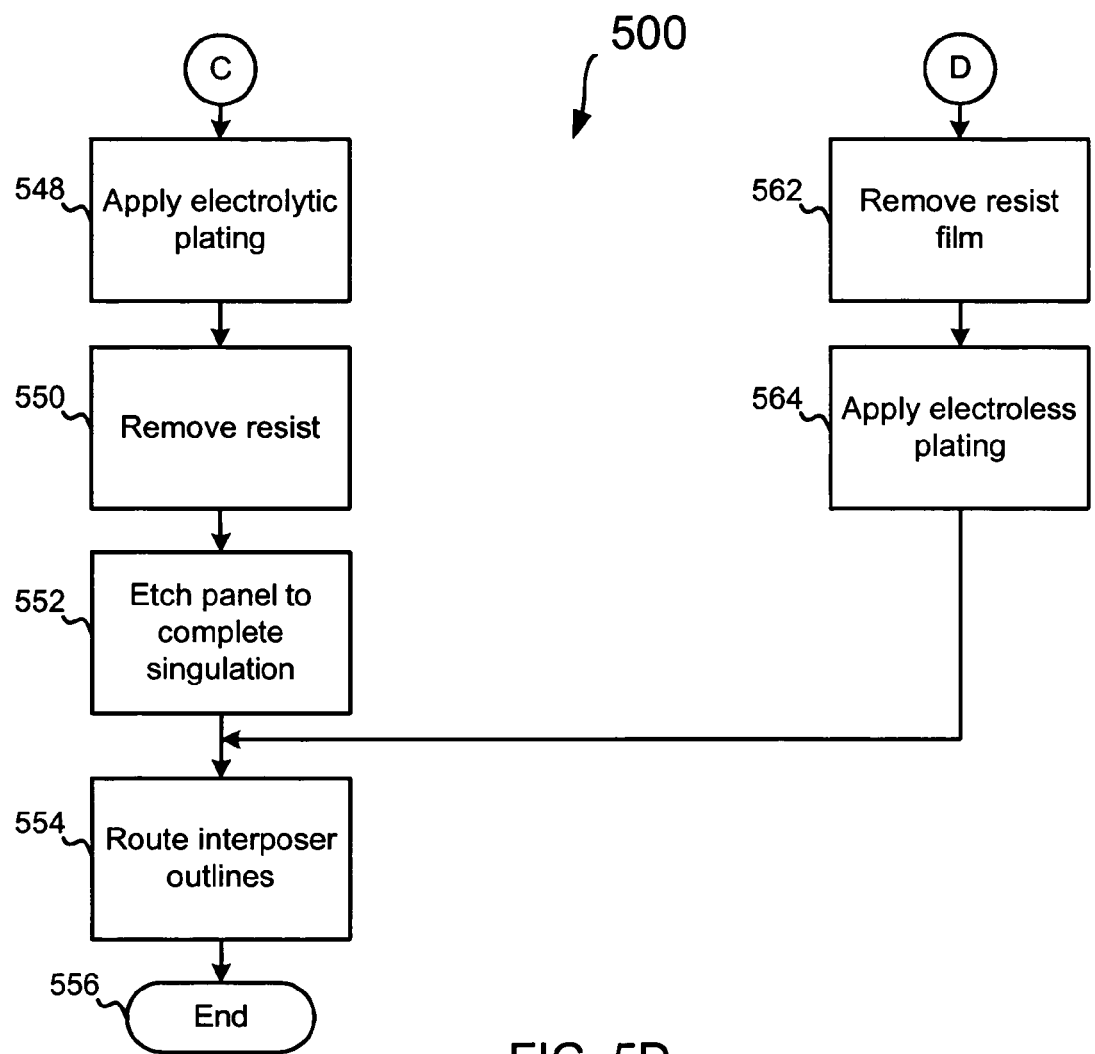

FIG. 4 is an exploded perspective view showing the assembly of an exemplary connector 400 in accordance with one configuration of the present invention. Connector 400 includes a first set of contact elements 402 that are located on a first major surface of a flexible substrate 404 and a second set of contact elements 406 that are located on a second major surface of substrate 404. Substrate 404 may be made of Kapton™, which is available as a laminate of one layer of Kapton 404a sandwiched between two layers of acrylic 404b, with the acrylic layers acting as adhesive joining contact elements 402 and 406 to Kapton layer 404a. Each corresponding pair of contact elements 402 and 406 is preferably aligned with a through hole 408 defined by substrate 404. Through holes 408 of substrate 404 preferably are not pre-plated, as described in more detail below.

The exploded view of FIG. 4 shows connector 400 during an intermediate step in the manufacturing process. Therefore, FIG. 4 shows the arrays of contact elements 402 and 406 connected together on a sheet of metal or metallic material from which they are formed. Subsequent manufacturing steps pattern the sheets and remove unwanted portions, so that the contact elements are isolated (i.e., singulated) as needed. For example, the metal sheet can be masked and etched to singulate some or all of the contact elements.

In one aspect of the present invention, a connector is formed as follows. First, flexible dielectric substrate 404 is provided, which has an array of through holes 408. Although conductive paths can be pre-plated in through holes 408 between the top surface and the bottom surface of substrate 404, such pre-plating is not necessary. Indeed, because of the minimal thickness of flexible substrate 404, contacts elements 402 and 406 are in close proximity to each other when adhered to opposite sides of substrate 404, such that they can be conveniently connected in a subsequent plating process. In one example, substrate 404 is Kapton™ with acrylic layers applied to both sides.

Corresponding to the array of through holes 408 in substrate 404, a conductive metal sheet or a multilayer metal sheet is then patterned to form an array of contact elements 402 and 406 including a base portion and one or more elastic portions. The contact elements, including the elastic or spring portions, can be formed by etching, stamping, or other means. The metal sheet 402 is attached to the first major surface of the flexible dielectric substrate 404 using, for example, an acrylic layer provided integrally with the substrate itself. When a second set of contact elements is to be included, a second conductive metal sheet or multilayer metal sheet 406 is similarly patterned and attached to the second major surface of the flexible dielectric substrate 404. The metal sheets can then be patterned to chemically remove unwanted metal from the sheets, so that the contact elements are isolated from each other (i.e., "singulated") as needed. The metal sheets can be patterned by etching, scribing, stamping, or other means.

In an alternative configuration, the protrusion of the elastic portions can be formed after the metal sheet, including patterned contact elements, has been attached to the flexible dielectric substrate. In another alternative configuration, the unwanted portions of the metal sheets can be removed before the contact elements are formed. Also, the unwanted portions of the metal sheets can be removed before the metal sheets are attached to substrate 404.

After metal sheets 402 and 406 are patterned to form individual contact elements and laminated to flexible substrate 404, the entire structure can be plated (e.g., by electroless plating) to form conductive traces in through holes 408, thereby connecting the contact elements through holes 408 and over the short distance to the respective terminals on the other side of flexible dielectric substrate 404. In this manner, the present invention can avoid the added time and expense involved in pre-plating substrate 404 to form conductive traces through holes 408. In the final assembly, metal traces through holes 408 connect contact elements from the first major surface to opposing contact elements from the second major surface to form a monolithic structure.

Optionally, as shown in FIG. 4, conductive traces 410 can be pre-formed on the surface of substrate 404 in a ring-shaped pattern encircling each through hole 408. This conductive ring 410 can enhance the electrical connection between the contact elements on the metal sheet and the conductive traces formed in substrate 404.

As one of ordinary skill in the art would appreciate, the method described above for forming connector 400 of FIG. 4 could be used as part of many different manufacturing processes, which, for example, apply further plating depending on the requirements of a particular application. For example, as described in more detail below, after laminating substrate 404 (which is not pre-plated) and sheets 402 and 406 together, chemically singulating sheets 402 and 406, and plating the entire structure to connect corresponding contact elements of sheets 402 and 406 together, additional plating (e.g., hard or soft gold) could be applied to the structure to satisfy specific performance requirements (e.g., contact finish requirements). Thus, notwithstanding the particular methods described herein, the present invention should be considered broadly applicable to any application that can benefit from a method or configuration that eliminates the need for pre-plating through holes of a substrate.

Illustrating one exemplary implementation of the present invention, FIGS. 5A–5D provide flowcharts outlining an exemplary method 500 for forming contact elements. Method 500 also relates to batch fabrication of the contact elements using masking, chemical etching, forming, and lamination techniques. Method 500 produces a plurality of highly engineered electrical contacts, capable of use in a separable connector such as in an interposer. Or, the contacts can be directly integrated into a substrate as a continuous trace that then functions as a permanent onboard connector. However, rather than using additional masking and etching steps to form the three dimensional spring portions, they are created in flat arrays and are then formed into three dimensional shapes.

As shown in FIG. 5A, method 500 begins in step 502 with the selection of a base spring material for the sheet of contacts, such as beryllium copper (Be—Cu), spring steel, phosphorous bronze, or any other material with suitable mechanical properties. The proper selection of material enables the contact elements to be engineered to have the desired mechanical and electrical properties. One factor in the selection of the base material is the working range of the material. As used herein, working range refers to the range of displacement over which the deformable contact portion can be mechanically displaced while meeting predetermined performance criteria including, without limitation, physical characteristics such as elasticity and spatial memory and electrical characteristics such as resistance, impedance, inductance, capacitance and/or elastic behavior. For example, assume that the desired contact resistance is less than 20 milliohms and the maximum allowed contact load is 40 grams. If the contact element reaches a resistance range of less than 20 milliohms at 10 grams of load and then is carried over to the maximum load of 40 grams for the beam member, while maintaining a resistance of less than 20 milliohms, then the deflection of the contact results in between 10 grams and 40 grams of load. The range of deflection and maximum resistance is the working range of the contact.

Optionally, in step 504, the sheet is heat treated prior to subsequent processing. Whether the sheet is heated at this point in the process is determined by the type of material selected for the sheet. Heating raises the yield stress of the base spring material by solid state precipitation on the Be from the Cu matrix to provide desired mechanical properties for forming the contacts.

In step 506, a contact element is designed and is copied into an array form, for use in batch processing. The number of contacts in an array is a design choice and can be selected from a library of contacts that can vary depending on the requirements for the connector. The arrays are repeated into a panel format, analogous to chips or die in a semiconductor wafer, resulting in a scalable design that lends itself to batch processing. After the contact design has been completed (usually in a CAD drawing environment), the design is ported to a Gerber format, which is a translator that enables the design to be ported to a fabrication facility to produce the master slides or film to be used in the subsequent steps.

The panel format can have anywhere between one and a large number of contacts, because the use of lithography permits placing a high density of contacts onto a panel. This high density of contacts provides an advantage over existing methods in that a batch process can be used to chemically singulate the contacts, as opposed to stamping and forming individual contacts. Method 500 permits a large number of contacts to be patterned, developed, and etched at once.

In step 508, a lithographically sensitive resist film is then applied to both sides of the sheet. A dry film can be used for larger feature sizes ranging from one to 20 mils, and a liquid resist can be used for feature sizes less than one mil.

Using the artwork defined in step 506, both the top and bottom of the sheet are exposed to ultraviolet (UV) light and then developed to define contact features in the resist, in step 510. Portions that are intended to be etched are left unprotected by the mask. Using a lithographic process to define the contact elements enables the printing of lines with a fine resolution, similar to that found in semiconductor manufacturing.

In step 512, the sheet is then etched in a solution specifically selected for the material being used. Each particular material that can be selected for the sheet typically has a specific etch chemistry associated with it to provide the best etch characteristics, such as etch rate (i.e., how well and how fast the solution performs the etch). This is an important consideration in the context of throughputs. The etchant selected also affects other characteristics like the sidewall profile, or the straightness of a feature as seen in cross section. In method 500, chemicals common in the industry are used, such as cupric chloride, ferric chloride, and sulfuric hydroxide. Once etched, in step 514, the protective layer of resist is removed in a stripping process, leaving the etched features in the sheet.

In step 516, a batch forming tool is designed based upon the artwork defined in step 506. In one configuration, the batch forming tool includes a plurality of ball bearings arranged into an array format, preferably by being set into an array of openings in a support surface. The ball bearings can be of different sizes, to apply different forces to the contacts, thereby imparting different mechanical characteristics to contacts on the same panel. The curvature of the ball bearings is used to push the flanges away from the plane of the sheet. Other forming tool configurations may be used to form different contact shapes. In step 518, the flanges of the contacts are then formed in all three axes by applying the forming tool to the sheet, to produce the desired contact elements in a batch process.

Optionally, in step 520, the sheet can be heat treated to stress relieve regions caused by the forming process. As with step 504, heating is dependent upon the material selected for the sheet. Based upon the material and the size of the contacts to be defined on the sheet, heating may be performed to obtain the physical properties desired for optimal forming conditions.

In step 522, the sheet is then surface treated to enhance adhesion properties for a subsequent lamination process. If there is inadequate adhesion, there is a propensity for the sheet to separate from a substrate or delaminate. Several methods for performing the surface treating can be used, including micro etching and a black oxide process. The micro etching is used to pit the surface of the sheet, effectively creating a greater surface area (by making the surface rough and cratered) to promote better adhesion.

Prior to pressing, in step 524, a substrate comprising a combined low flow adhesion material and flexible dielectric core (e.g., an acrylic-Kapton-acrylic sandwich) is provided with holes that are in registration with and located beneath the flange elements. In accordance with a significant aspect of the present invention, preferably this substrate is not pre-plated, i.e., there are no conductive traces through the holes.

During pressing/lamination, there can be excess flow of adhesion material up on the flange that can alter the contact properties, causing the contact element to be unsuitable for electrical and mechanical use. In the event such undesirable flow occurs, the laminated stack can be de-smeared with, e.g., an O2 plasma. Alternatively, or additionally, the holes provided in the substrate can be made with a diameter somewhat larger than a diameter of the openings in the copper sheet beneath the flanges, to provide "bleed" areas into which excess adhesive can flow. With such a configuration, even if some of the acrylic, for instance, were to ooze out from between the Kapton and copper sheet, the excess acrylic would not reach the flanges themselves, and thus not alter their properties. In any event, a cleaning or de-smearing step may be provided to ensure that any excess flow is removed, prior to plating.

Figure 6:
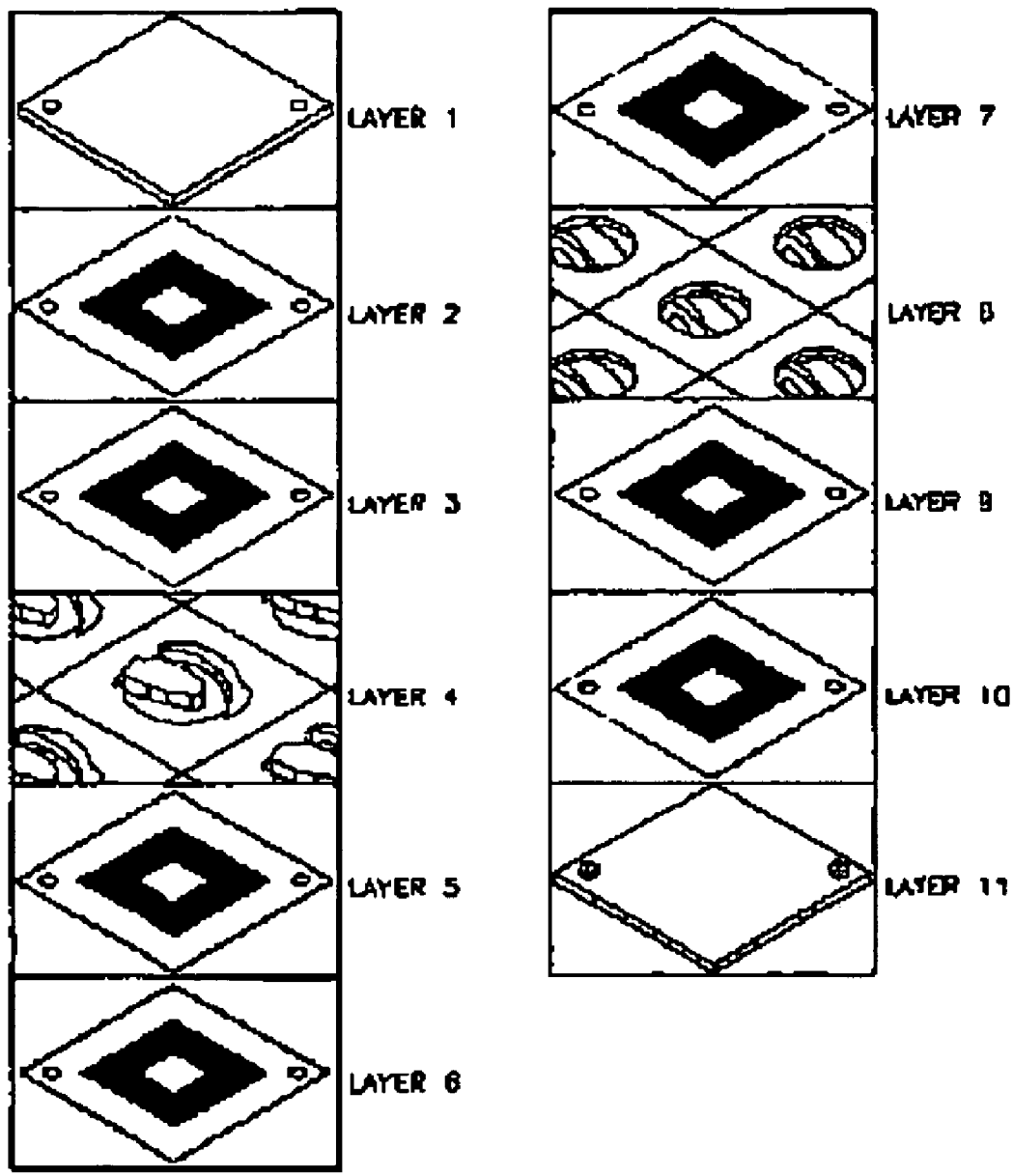
FIG. 6 is schematic diagram of a view of each layer of an exemplary stack up made according to the method shown in FIGS. 5A–5D.

FIG. 6 shows each layer of an exemplary stack up generated for lamination pressing, according to step 526. This arrangement could be altered to have the contact elements inserted as internal layers. Layer 1 is a top press plate material. Layer 2 is a spacer material with a relief hole over the spring contact element. Layer 3 is a release material with a relief hole over the spring contact. Layer 4 is a top sheet of formed contact sheets (e.g., 402 of FIG. 4). Layer 5 is an adhesion material (e.g., acrylic 404b of FIG. 4), preferably with a relief hole beneath the spring contact. Layer 6 is a core dielectric (e.g., 404a of FIG. 4) with relief holes under and above the spring contact. Layer 7 is an adhesion material (e.g., acrylic 404b of FIG. 4), preferably with a relief hole above the spring contact. Layer 8 is a bottom sheet of formed contact elements (e.g., 406 of FIG. 4). Layer 9 is a release material with a relief hole below the spring contact. Layer 10 is a spacer material with a relief hole below the spring contact element. Layer 11 is a bottom press plate material.

In step 528, the stack up is preferably pressed under temperature conditions optimized for desired adhesions and flow conditions for the adhesion material. During this operation, the top and bottom contact sheets are bonded to a core dielectric material. After a cool down period, in step 530, the stack up is removed from the press plates, leaving a panel comprised of layers 4–8 of FIG. 6.

In step 532, the panel surfaces and openings are then plated to electrically connect the top and bottom flanges. This plating can be, for example, an electroless process, which contiguously deposits a conductive material on the top surface, into the through hole to connect both sheets of contact elements, and then onto the sheet on the other side of the substrate to form a monolithic structure. The plating process creates a route for an electrical current to travel from one side of the board to the other. The thickness of the plating can be chosen to account for the current loads that the connector elements are intended to carry.

Next, in step 534, a photosensitive resist film is applied to both sides of the panel. A pattern is exposed and developed to define the individual contact elements in step 536. At this point in the process, a connector such as connector 400 has been formed, which has a first array of contacts connected through plated holes to a second array of contacts. Depending on the demands of application for which the connector is intended, the connector could be singulated at this point, without further plating.

To satisfy particular application requirements, however, method 500 can continue and apply further plating. Accordingly, in step 538, an appropriate contact finish type, for example, either hard gold or soft gold, is determined. Hard gold is typically used in specific applications where the numbers of insertions required are high, such as a test socket. Hard gold itself has impurities that cause the gold to be more durable. Soft gold is a pure gold, so it effectively has no impurities, and is typically used in the PCB or networking space, where the number of insertions is fairly low. For example, a package to board socket used in a PC (soft gold) will typically see on the order of one to 20 insertions, whereas other technology using hard gold will see a number of insertions between 10 and 1,000,000.

If the contact finish is a hard gold, a layer of resist will have been applied in step 534 covering both sides of the panel. The panel is then submitted for electrolytic Cu/Ni/Au plating via a hard gold process in step 548.

The resist is removed in step 550 and the entire panel is etched in step 552 using, for example, electrolytic Ni/Au as a hard mask to complete singulation of the contact array. In step 554, final interposer outlines are routed out of the panel to separate the panel into individual connector arrays. Method 500 then ends at step 556.

If a soft gold finish is determined at step 538, then etching is used to completely singulate the contact elements in step 560. The resist film is removed via a stripping process in step 562. In step 564, electroless Ni/Au, also known as a soft gold, is plated onto the panel, covering the contact elements. In step 554, final interposer outlines are routed out of the panel to separate the panel into individual connector arrays. Method 500 then ends at step 556.

The soft gold finishing process singulates the contacts prior to plating. Ni/Au will plate only on metal surfaces, and provides a sealing mechanism for the contact element. This helps to prevent potential corrosive activity that could occur over the system life of the contact, since gold is virtually inert. Singulation prior to plating is a means to isolate or encapsulate the copper contact with another metal, resulting in cleaner imaging and a cleaner contact, which has a low propensity for shorting.

According to other configurations of the present invention, a connector is provided with contact elements having different operating properties. That is, the connector can include heterogeneous contact elements where the operating properties of the contact elements can be selected to meet requirements in the desired application. The operating properties of a contact element refer to the electrical, mechanical, and reliability properties of the contact element. By incorporating contact elements with different electrical and/or mechanical properties, a connector can be made to meet all of the stringent electrical, mechanical, and reliability requirements for high-performance interconnect applications.

According to alternative configurations of the present invention, the electrical properties can be specifically engineered for a contact element or a set of contact elements to achieve certain desired operational characteristics by selecting materials for forming contacts and through holes, their dimensions, pitch heat treatment and the like. For instance, the DC resistance, RF interference, the impedance, the inductance, and the current carrying capacity of each contact element can be varied primarily by material selection and mechanical properties. Thus, a group of contact elements can be engineered to have lower resistance or to have low inductance. The contact elements can also be engineered to display no or minimal performance degradation after environmental stresses such as thermal cycling, thermal shock and vibration, corrosion testing, and humidity testing. The contact elements can also be engineered to meet other reliability requirements defined by industry standards, such as those defined by the Electronics Industry Alliance (EIA).

The mechanical and electrical properties of the contact elements can be modified by changing the following design parameters. First, the thickness of the spring portion of the contact element can be selected to give a desired contact force. For example, a thickness of about 30 microns typically gives a low contact force on the order of 10 grams or less, while a flange thickness of 40 microns gives a higher contact force of 20 grams for the same displacement. The width, length, and shape of the spring portion can also be selected to give the desired contact force.

Second, the number of spring portions included in a contact element can be selected to achieve the desired contact force, the desired current carrying capacity, and the desired contact resistance. For example, doubling the number of spring portions roughly doubles the contact force and current carrying capacity, while roughly decreasing the contact resistance by a factor of two.

Third, the shape of the spring portion can be designed to give certain electrical and mechanical properties. The height of the spring portion, or the amount of projection from the base portion, can also be varied to give the desired electrical and mechanical properties.

The scalability of the present invention is not limited, and can be easily customized for production due to the lithographic techniques used and the simple tooling die used for forming the connector elements in three dimensions.

The foregoing disclosure has been presented for purposes of illustration and description. It is not intended to be exhaustive or to limit the invention to the precise forms disclosed. Many variations and modifications will be apparent to one of ordinary skill in the art in light of the above disclosure. The scope of the invention is to be defined only by the claims appended hereto, and by their equivalents.

Further, in describing the present invention, the specification may have presented a method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A flexible electrical connector, comprising:
    a flexible substrate having a first surface and a second surface, the flexible substrate defining a plurality of through holes from the first surface to the second surface;
    a first conductive layer adhered to the first surface of the flexible substrate;
    a second conductive layer adhered to the second surface of the flexible substrate,
        each of the first and second conductive layers having a plurality of raised contact elements in registration with at least a subset of the plurality of through holes; and
    a plating contiguously applied over the first conductive layer, the plurality of through holes in the flexible substrate, and the second conductive layer such that at least some contact elements on the first and second conductive layers that oppose each other are in electrical communication with one another by way of the plating.

2. The connector of claim 1, further comprising a first adhesive layer disposed between the first surface of the flexible substrate and the first conductive layer and a second adhesive layer disposed between the second surface of the flexible substrate and the second conductive layer.

3. The connector of claim 2, the first adhesive layer and the second adhesive layer comprising a low flow adhesion material.

4. The connector of claim 3, the adhesion material comprising acrylic.

5. The connector of claim 1, having compound compliance (C), the compound compliance being comprised of a first compliance (C1) attributable to the flexible substrate and a second compliance (C2) attributable to the raised contact elements.

6. The connector of claim 1, the plurality of through holes of the flexible substrate being non-conductive between the first surface and the second surface before the plating is applied.

7. The connector of claim 1, the flexible substrate having a thickness sufficient to enable the plating to electrically connect the opposing contact elements.

8. The connector of claim 7, the flexible substrate having a thickness within a range of approximately ½ to 5 mils.

9. The connector of claim 1, having a first array of contact elements and a second array of contact elements, both the first and second arrays sharing the same flexible substrate but being oriented in different planes with respect to each other.

10. The connector of claim 1, each contact element extending above the flexible substrate and towards a center of a corresponding through hole in the flexible substrate.

11. The connector of claim 1, the first and second conductive layers being arranged to be in registration with a land grid array (LGA) or ball grid array (BGA) contact system.

12. The connector of claim 1, each of the contact elements comprising beryllium copper and the plating comprising copper.

13. The connector of claim 1, further comprising a second plating contiguously applied over the first conductive layer, the plurality of through holes in the flexible substrate, and the second conductive layer.

14. The connector of claim 1, at least some of the contact elements having electrical and mechanical properties different from others of the contact elements.

15. The connector of claim 1, the first conductive layer defining a plurality of openings aligned with the plurality of through holes in the flexible substrate, an opening in the first conductive layer having a diameter smaller than its corresponding hole in the flexible substrate such that a bleed area is provided into which excess adhesion material can flow.

16. A flexible electrical connector, comprising:
   a flexible substrate;
   a first set of chemically singulated contacts adhered to a first surface of the flexible substrate;
   a second set of chemically singulated contacts adhered to a second surface of the flexible substrate, the second surface being opposite the first surface;
   respective ones of at least some of the first set and second set of singulated contacts being in electrical contact with each other by plating contiguously applied over the respective ones of at least some of the first set and second set of singulated contacts and over through holes in the flexible substrate that are in registration with the respective ones of at least some of the first set and second set of singulated contacts, and
   the singulated contacts comprising contact elements extending above the flexible substrate and towards a center of a corresponding through hole.

17. The connector of claim 16, further comprising adhesive material disposed between the flexible substrate and each of the singulated contacts.

18. The connector of claim 16, having compound compliance (C), the compound compliance being comprised of a first compliance (C1) attributable to the flexible substrate and a second compliance (C2) attributable to the contacts.

19. The connector of claim 16, having a first array of singulated contacts and a second array of singulated contacts, both the first and second arrays sharing the same flexible substrate but being oriented in different planes with respect to each other.

20. The connector of claim 16, the first and second sets of singulated contacts being arranged to be in registration with a land grid array (LGA) or ball grid array (BGA) contact system.

21. The connector of claim 16, each of the contact elements comprising beryllium copper and the plating comprising copper.

22. The connector of claim 16, at least some of the contact elements having electrical and mechanical properties different from others of the contact elements.

23. The connector of claim 16, the flexible substrate comprising polyimide.

24. The connector of claim 16, the contiguously applied plating forming a monolithic structure.

25. The connector of claim 16, the plurality of through holes of the flexible substrate having no pre-plating between the first surface and the second surface before the contiguously applied plating is applied.

* * * * *

UNITED STATES PATENT AND TRADEMARK OFFICE
CERTIFICATE OF CORRECTION

PATENT NO. : 7,114,961 B2
APPLICATION NO. : 11/265205
DATED : October 3, 2006
INVENTOR(S) : Williams It is certified that error appears in the above-identified patent and that said Letters Patent is hereby corrected as shown below:

On the face page, in field (63), under "Related U.S. Application Data", in column 1, line 2, delete "2003." and insert -- 2003, now Pat. No. 7,056,131. --, therefor.

On the face page, in field (56), under "U.S. Patent Documents", in column 2, line 4, after "6,428,328" delete "B1" and insert --B2--, therefor.

On the face page, in field (56), under "U.S. Patent Documents", in column 2, line 5, after "6,517,362" delete "B1" and insert --B2--, therefor.

On the face page, in field (56), under "U.S. Patent Documents", in column 2, line 6, after "6,558,560" delete "B1" and insert -- B2 --, therefor.

On the face page, in field (56), under "U.S. Patent Documents", in column 2, line 7, after "6,627,092" delete "B1" and insert -- B2 --, therefor.

On the face page, in field (56), under "U.S. Patent Documents", in column 2, line 8, after "6,661,247" delete "B1" and insert --B2--, therefor.

On the face page, in field (56), under "U.S. Patent Documents", in column 2, line 9, after "6,664,131" delete "B1" and insert --B2--, therefor.

On the face page, in field (56), under "U.S. Patent Documents", in column 2, line 10, after "6,763,581" delete "B1" and insert --B2--, therefor.

On the face page, in field (56), under "U.S. Patent Documents", in column 2, line 11, after "6,821,129" delete "B1" and insert --B2--, therefor.

On the face page, in field (56), under "U.S. Patent Documents", in column 2, line 12, after "6,869,290" delete "B1" and insert --B2--, therefor.

On the face page, in field (56), under "U.S. Patent Documents", in column 2, line 13, after "6,916,181" delete "B1" and insert --B2--, therefor.

In column 1, line 5, after "10/412,729" insert -- , --.

In column 1, line 6, delete "2003." and insert --2003, now U.S. Pat. No. 7,056,131. --, therefor.

In column 2, line 67, delete "application" and insert -- Application --, therefor.

UNITED STATES PATENT AND TRADEMARK OFFICE
CERTIFICATE OF CORRECTION

PATENT NO.       : 7,114,961 B2
APPLICATION NO.  : 11/265205
DATED            : October 3, 2006
INVENTOR(S)      : Williams It is certified that error appears in the above-identified patent and that said Letters Patent is hereby corrected as shown below:

In column 7, line 30, delete "O2" and insert --$O_2$--, therefor.

Signed and Sealed this

Third Day of April, 2007

JON W. DUDAS
*Director of the United States Patent and Trademark Office*